(12) United States Patent
    Sridaran et al.

(10) Patent No.: US 9,667,220 B2
(45) Date of Patent: May 30, 2017

(54) TEMPERATURE CONTROLLED ACOUSTIC RESONATOR COMPRISING HEATER AND SENSE RESISTORS

(71) Applicant: Avago Technologies General IP (Singapore) Pte. Ltd., Singapore (SG)

(72) Inventors: Suresh Sridaran, Fort Collins, CO (US); Richard C. Ruby, Menlo Park, CA (US); Martha K. Small, Fort Collins, CO (US); Donald Lee, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 499 days.

(21) Appl. No.: 14/262,737

(22) Filed: Apr. 26, 2014

(65) Prior Publication Data

US 2014/0232244 A1    Aug. 21, 2014

Related U.S. Application Data

(63) Continuation-in-part of application No. 13/216,663, filed on Aug. 24, 2011, now Pat. No. 8,948,882, and a continuation-in-part of application No. 13/361,725, filed on Jan. 30, 2012, now Pat. No. 9,106,758, and a continuation-in-part of application No. 14/159,518, filed on Jan. 21, 2014.

(51) Int. Cl.
    *H01L 41/04*    (2006.01)
    *H03H 9/05*     (2006.01)
    *H03H 9/02*     (2006.01)
    *H03H 9/08*     (2006.01)

(52) U.S. Cl.
    CPC ...... *H03H 9/0519* (2013.01); *H03H 9/02102* (2013.01); *H03H 9/08* (2013.01)

(58) Field of Classification Search
    CPC ..... H03H 9/0519; H03H 9/02102; H03H 9/08
    USPC ......................................... 333/188
    See application file for complete search history.

(56) References Cited

U.S. PATENT DOCUMENTS

| 5,260,596 | A |   | 11/1993 | Dunn et al. |
|-----------|---|---|---------|-------------|
| 5,587,620 | A |   | 12/1996 | Ruby et al. |
| 5,780,713 | A | * | 7/1998  | Ruby ...................... C23C 16/08 29/25.35 |
| 5,873,153 | A |   | 2/1999  | Ruby et al. |
| 5,910,756 | A |   | 6/1999  | Ella |
| 5,917,272 | A |   | 6/1999  | Clark et al. |
| 5,977,840 | A |   | 11/1999 | Connell et al. |

(Continued)

OTHER PUBLICATIONS

Jha, et al., "Thermal Isolation of Encapsulated MEMS Resonators", Journal of Microelectromechanical Systems, vol. 17, No. 1, Feb. 2008, 175-184.

(Continued)

*Primary Examiner* — Stephen E Jones
*Assistant Examiner* — Scott S Outten

(57) ABSTRACT

A bulk acoustic wave (BAW) resonator device comprises a heating coil disposed over a first side of the piezoelectric layer and substantially around a perimeter adjacent to the active area of the acoustic resonator, the heating coil comprising a resistor configured to receive a heater current; and a heat sensor disposed over a second side of the piezoelectric layer and opposing the first side, the heat sensor configured to adjust the heater current in response to a temperature of the heating coil.

26 Claims, 11 Drawing Sheets

(56) References Cited

U.S. PATENT DOCUMENTS

| | | | |
|---|---|---|---|
| 6,060,818 A | 5/2000 | Ruby et al. | |
| 6,107,721 A | 8/2000 | Lakin | |
| 6,111,338 A | 8/2000 | Otsuchi et al. | |
| 6,228,675 B1 | 5/2001 | Ruby et al. | |
| 6,262,637 B1 | 7/2001 | Bradley et al. | |
| 6,265,246 B1 | 7/2001 | Ruby et al. | |
| 6,384,697 B1 | 5/2002 | Ruby | |
| 6,429,511 B2 | 8/2002 | Ruby et al. | |
| 6,507,983 B1 | 1/2003 | Ruby et al. | |
| 6,635,519 B2 | 10/2003 | Barber et al. | |
| 6,707,351 B2 * | 3/2004 | Gorrell | H03H 3/0077 257/414 |
| 6,762,471 B2 | 7/2004 | Kim | |
| 6,787,897 B2 | 9/2004 | Geefay et al. | |
| 6,828,713 B2 | 12/2004 | Bradley et al. | |
| 6,919,222 B2 | 7/2005 | Geefay | |
| 6,979,597 B2 | 12/2005 | Geefay et al. | |
| 6,984,925 B2 | 1/2006 | Morley et al. | |
| 7,161,283 B1 | 1/2007 | Geefay | |
| 7,268,647 B2 | 9/2007 | Sano et al. | |
| 7,275,292 B2 | 10/2007 | Ruby et al. | |
| 7,280,007 B2 | 10/2007 | Feng et al. | |
| 7,312,675 B2 | 12/2007 | Ruby et al. | |
| 7,345,410 B2 | 3/2008 | Grannen et al. | |
| 7,388,454 B2 | 6/2008 | Ruby et al. | |
| 7,563,475 B2 | 7/2009 | Ruby et al. | |
| 7,576,471 B1 | 8/2009 | Solal | |
| 7,619,493 B2 | 11/2009 | Uno et al. | |
| 7,623,007 B2 | 11/2009 | Nakatsuka et al. | |
| 7,629,865 B2 | 12/2009 | Ruby | |
| 7,714,684 B2 | 5/2010 | Ruby et al. | |
| 7,791,434 B2 | 9/2010 | Fazzio et al. | |
| 7,795,781 B2 | 9/2010 | Barber et al. | |
| 7,889,024 B2 | 2/2011 | Bradley et al. | |
| 7,986,075 B2 | 7/2011 | Asai et al. | |
| 8,188,810 B2 | 5/2012 | Fazzio et al. | |
| 8,248,185 B2 | 8/2012 | Choy et al. | |
| 2005/0012571 A1 | 1/2005 | Song et al. | |
| 2005/0028336 A1 | 2/2005 | Robert et al. | |
| 2005/0269904 A1 | 12/2005 | Oka | |
| 2006/0071736 A1 | 4/2006 | Ruby et al. | |
| 2007/0035214 A1 | 2/2007 | Kasahara | |
| 2007/0205850 A1 | 9/2007 | Jamneala et al. | |
| 2008/0111651 A1 | 5/2008 | Isobe et al. | |
| 2008/0283944 A1 | 11/2008 | Geefay | |
| 2009/0014653 A1 | 1/2009 | Parrish | |
| 2009/0127978 A1 * | 5/2009 | Asai | H03H 3/02 310/322 |
| 2010/0176899 A1 | 7/2010 | Schaufele et al. | |
| 2010/0187948 A1 | 7/2010 | Sinha et al. | |
| 2010/0315179 A1 * | 12/2010 | Schoepf | H03H 9/02448 333/186 |
| 2010/0327697 A1 | 12/2010 | Choy et al. | |
| 2010/0327994 A1 | 12/2010 | Choy et al. | |
| 2011/0180391 A1 | 7/2011 | Larson, III et al. | |
| 2012/0107557 A1 * | 5/2012 | Akiyama | C23C 14/0617 428/141 |
| 2012/0177816 A1 | 7/2012 | Larson, III et al. | |
| 2012/0326807 A1 | 12/2012 | Choy et al. | |
| 2013/0049888 A1 | 2/2013 | Ruby | |
| 2013/0194057 A1 | 8/2013 | Ruby | |

OTHER PUBLICATIONS

Ruby, "Micromachined Cellular Filters", Hewlett-Packard Laboratories, Hewlett-Packard, Palo Alto, CA 94304, 1996 IEEE MTT-S Digest, 1149-1152.

Unkrich, "FBAR Resonator Mechanical Stress Relief", IP.com No. IPCOM000214956D, IP.com Electronic Publication, Feb. 15, 2012.

Vig, "Introduction to Quartz Frequency Standards", Research and Development Technical Report SLCET-TR-92-1 (Rev. 1), Distribution Statement, Army Research Laboratory, Electronics and Power Sources Directorate, Fort Monmouth, NY 07703-5601, U.S.A., Oct. 1992, 56 pages.

Co-pending U.S. Appl. No. 12/891,039, filed Sep. 27, 2010.
Co-pending U.S. Appl. No. 13/162,883, filed Jun. 17, 2011.
Co-pending U.S. Appl. No. 13/216,633, filed Aug. 24, 2011.
Co-pending U.S. Appl. No. 14/161,564, filed Jan. 22, 2014.
Co-pending U.S. Appl. No. 13/662,460, filed Oct. 27, 2012.
Co-pending U.S. Appl. No. 13/906,873, filed May 31, 2013.
Co-pending U.S. Appl. No. 14/190,361, filed Feb. 26, 2014.
Co-pending U.S. Appl. No. 14/191,771, filed Feb. 27, 2014.

* cited by examiner

TEMPERATURE CONTROLLED ACOUSTIC RESONATOR COMPRISING HEATER AND SENSE RESISTORS

CROSS-REFERENCE TO RELATED APPLICATIONS

The present application is a continuation-in-part of and claims priority under 35 USC. §120 from U.S. patent application Ser. No. 13/216,663 entitled "ACOUSTIC RESONATOR FORMED ON A PILLAR" to Richard C. Ruby, et al, and filed Aug. 24, 2011. The present application is also a continuation-in-part of and claims priority under 35 U.S.C. §120 from U.S. patent application Ser. No. 13/361,724 entitled "TEMPERATURE CONTROLLED ACOUSTIC RESONATOR" to Richard. C. Ruby, et al. and filed on Jan. 30, 2012. The present application is also a continuation-in-part of and claims priority under 35 U.S.C. §120 from U.S. patent application Ser. No. 14/159,518 entitled "FILM BULK ACOUSTIC WAVE RESONATOR (FBAR) HAVING STRESS-RELIEF" to Frank Bi, et al. and filed on Jan. 21, 2014. The entire disclosures of these parent applications are specifically incorporated herein by reference.

BACKGROUND

Acoustic resonators are used to filter electrical signals in various electronic applications. For example, acoustic resonators are used as bandpass filters in cellular phones, global positioning system (GPS) devices, and imaging applications, to name but a few.

An acoustic resonator can be characterized generally by a center frequency and bandwidth. However, due to a variety of intrinsic and extrinsic influences, the center frequency and bandwidth can drift over time, which may be referred to as frequency drift, or more generally "aging." One cause of aging in acoustic resonators is physical stress, specifically a differential stress. A differential stress refers to the membrane being forced to bow, buckle or be stretched (like a Kettle Drum) in response to differential forces applied to the different edges of the resonator. The source of this differential stress, that is the physical stress, can be caused, for example, by forces transmitted to the acoustic resonator through adjacent components.

Notably, the acoustic resonator is inside a small package; typically a chip-scale package. In many cases, the chip-scale package may be an all-silicon MEMs-like package. As an example, an acoustic resonator (in an all-silicon package can be mounted on a printed circuit board (PCB) comprising metal and laminate components. As the PCB is heated or cooled, the PCB may expand or contract unevenly because the metal and laminate components have different temperature coefficients of expansion. This uneven expansion or contraction can cause the PCB to change shape in a "potato chip" fashion. As the PCB changes shape, the PCB will transfer forces to the acoustic resonator through various intervening components, such as an epoxy bonding material, or the silicon package containing the acoustic resonator. As these forces are transferred to the acoustic resonator, they will change the center frequency of the acoustic resonator. Although the frequency change is relatively small, it is significant in terms of other sources of aging such as the electrode metal relaxation effect associated with quartz crystal aging.

FIG. 1A is a diagram illustrating an acoustic resonator inside of an all-silicon, chip-scale package mounted on a PCB using a standard epoxy, and FIG. 1B is a diagram illustrating forces applied to the acoustic resonator. For example, it may be assumed that acoustic resonator 115 is located inside a chip-scale package 100 mounted on a PCB 102. Forces are applied to the chip-scale package 100 from the PCB 102, and from the chip-scale package 100 to acoustic resonator structure as indicated by arrows in FIG. 1B. The forces shown in FIG. 1B can originate from various sources. For example, forces can originate from the PCB 101 when it has been warped in response to temperature changes, as described above. Alternatively, forces could originate from the PCB 101 that has been bent when clamped to a chassis or another motherboard, or from the soldering of the chip-scale package 100 onto the PCB 101.

More particularly, referring to FIGS. 1A and 1B, the chip-scale package 100 comprises a silicon substrate 105 with an acoustic resonator mounted inside (which may be a film bulk acoustic resonator (FBAR) or a contour mode acoustic resonator, or a Rayleigh-Lamb mode type resonator, for example) and a silicon lid (or microcap structure) 106. The lid 106 is attached to the substrate 105 by a sealant or gasket 123, for example. An air gap 110 is formed between substrate 105 and acoustic resonator 115 so that acoustic resonator 115 can resonate freely.

Curved lines 120 represent the interface of the mounted resonator shown with other structures, such as the PCB 101, the chip-scale packaging, etc. Forces created by, or presented to these structures can be present. These forces can be transferred from the package to substrate 105 through various intervening features, such as an epoxy bonding 122 or lid 106. The transferred forces create stresses 125 on substrate 105. Stresses 125 propagate through substrate 105 and other features to create stresses 130 where acoustic resonator 115 is connected to substrate 105. Stresses 130 exert torque on acoustic resonator 115, which can change the center frequency on the acoustic resonator 115.

FIG. 1C is a diagram illustrating a simulation of forces transferred from substrate 105 to acoustic resonator 115. As illustrated in FIG. 1C, the forces on substrate 105 cause stress at an edge of acoustic resonator 115. The stress is transmitted horizontally through acoustic resonator 115, which can affect the resonance of the acoustic resonator 115, as explained above.

FIG. 2A is a graph illustrating changes of the center frequency of a conventional acoustic resonator structure as a function of temperature, where the device temperature is swept from about 20° C. to about 130° C. several times. The parabolic nature of the frequency dependence on temperature is an intrinsic property of a so-called zero drift resonator (ZDR). However, the apparent hysteresis—or shift from one temperature run to the next—is due to the externally applied stresses. The graph of FIG. 2A was generated with the ZDR mounted on a PCB in laboratory conditions. A resonator under real-life conditions may experience even more frequency "hysteresis" than that illustrated in FIG. 2A.

Referring to FIG. 2A, the ZDR was heated from an initial temperature of approximately 70° C. to a temperature of approximately 130° C. The resonator was then cooled to approximately 25° C. and heated back to approximately 70° C. The center frequency of the acoustic resonator changed by approximately −50 ppm when the temperature was raised from 70° C. to 130° C. Then, as the temperature was cooled back to 70° C., the center frequency passed through a point at 0 ppm, which is offset from the original center frequency by approximately 20 ppm. As illustrated by the different center frequencies exhibited at 70° C., the center frequency of the acoustic resonator exhibits both temperature dependence as well as temperature based hysteresis. The parabolic temperature dependence is a property of the stiffness of the materials present in the acoustic stack of the ZDR and can be compensated elsewhere in the circuit. But, the hysteresis is created by variations in applied forces to the substrate. One cause for the change in force is that the epoxy (a hydrophilic material) outgases moisture and as the epoxy becomes more desiccated, it shrinks and thus applies a different force to the mounted ZDR. The use of softer epoxies helps mitigate, but not eliminate, the transfer of stress from the PCB to the acoustic resonator.

When injection molding is used to cover the die (as typical of today's ASIC chips in QFN packages), the transfer of stress is magnified and, if the customer does the injection molding, there is no hope of controlling the amount of offset in frequency created by the applied physical stresses.

The frequency changes shown in FIG. 2A will be too large for many high accuracy electronic applications. For example, GPS devices can only tolerate aging-related frequency changes on the order of +/−0.5 ppm. Similarly, wireless applications, such as low power radios used in WiFi or Bluetooth can only tolerate aging-related frequency changes on the order of +/−10 ppm.

Acoustic resonators have an associated turnover temperature (TOT), which is the temperature at which the center frequency does not change with temperature. FIG. 2B is a graph illustrating TOT curves for two different acoustic resonators, one having an AlN piezoelectric layer with a thickness of 29,530 Å and electrodes with a thickness of 2,800 Å (solid line), and another having an AlN piezoelectric layer with a thickness of 29,100 Å and electrodes with a thickness of 2,900 Å (dotted line). At TOT, changes in frequency versus changes in temperature are quite small. Therefore, when the temperature of the acoustic resonator is kept close to the TOT (e.g., within about 1° C.), the changes in frequency of the acoustic resonator due to any (ambient) temperature variations will be very small. For example, at TOT, the second order coefficient of temperature β of a typical ZDR stack is −20 ppb/C². Thus, even a maximum 1° C. temperature excursion would incur only a 0.02 ppm frequency shift. In comparison, the second order coefficient of temperature β of a ZDR, stack according to representative embodiments is only −10 ppb/C². This means that if the temperature (or the TOT) is off by +/−10° C., the error in stability is only +/−1 ppm.

What is needed, therefore, are techniques for reducing frequency drift due to physical stresses in acoustic resonator structures, including changes in temperature.

BRIEF DESCRIPTION OF THE DRAWINGS

The described embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION OF EMBODIMENTS

Figure 1A:
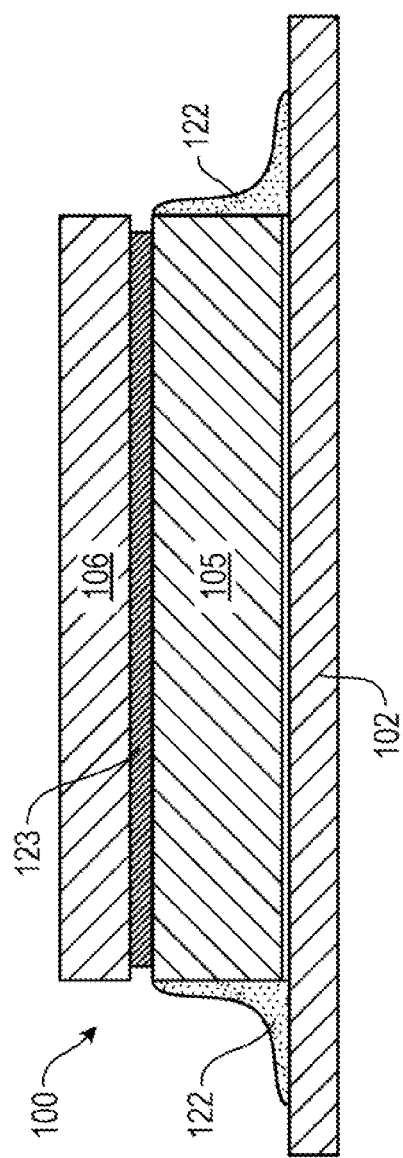
FIG. 1A is a diagram illustrating an acoustic resonator inside of an all-silicon, chip-scale package mounted on a PCB.
Figure 1B:
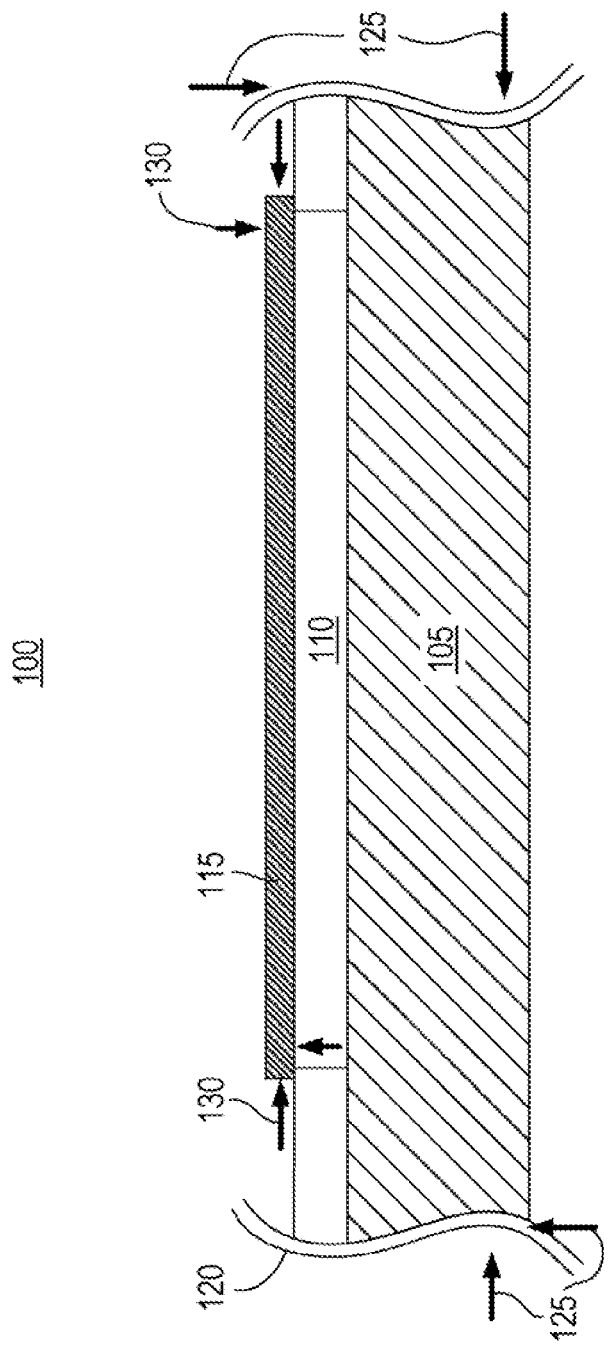
FIG. 1B is a diagram illustrating forces applied to a known acoustic resonator structure.
Figure 1C:
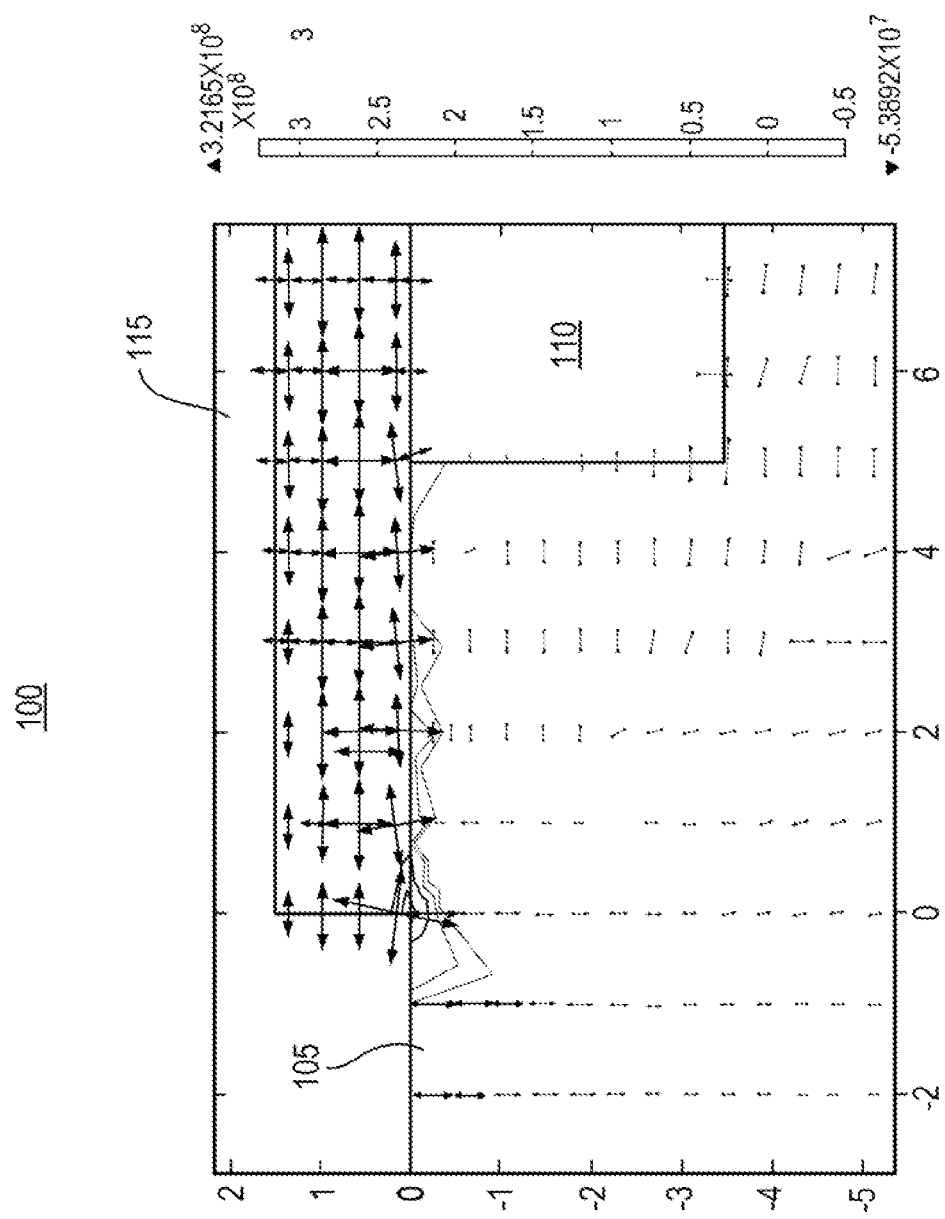
FIG. 1C is a diagram illustrating a simulation of forces transferred from a substrate to au FBAR in the acoustic resonator structure of FIG. 1B.
Figure 2A:
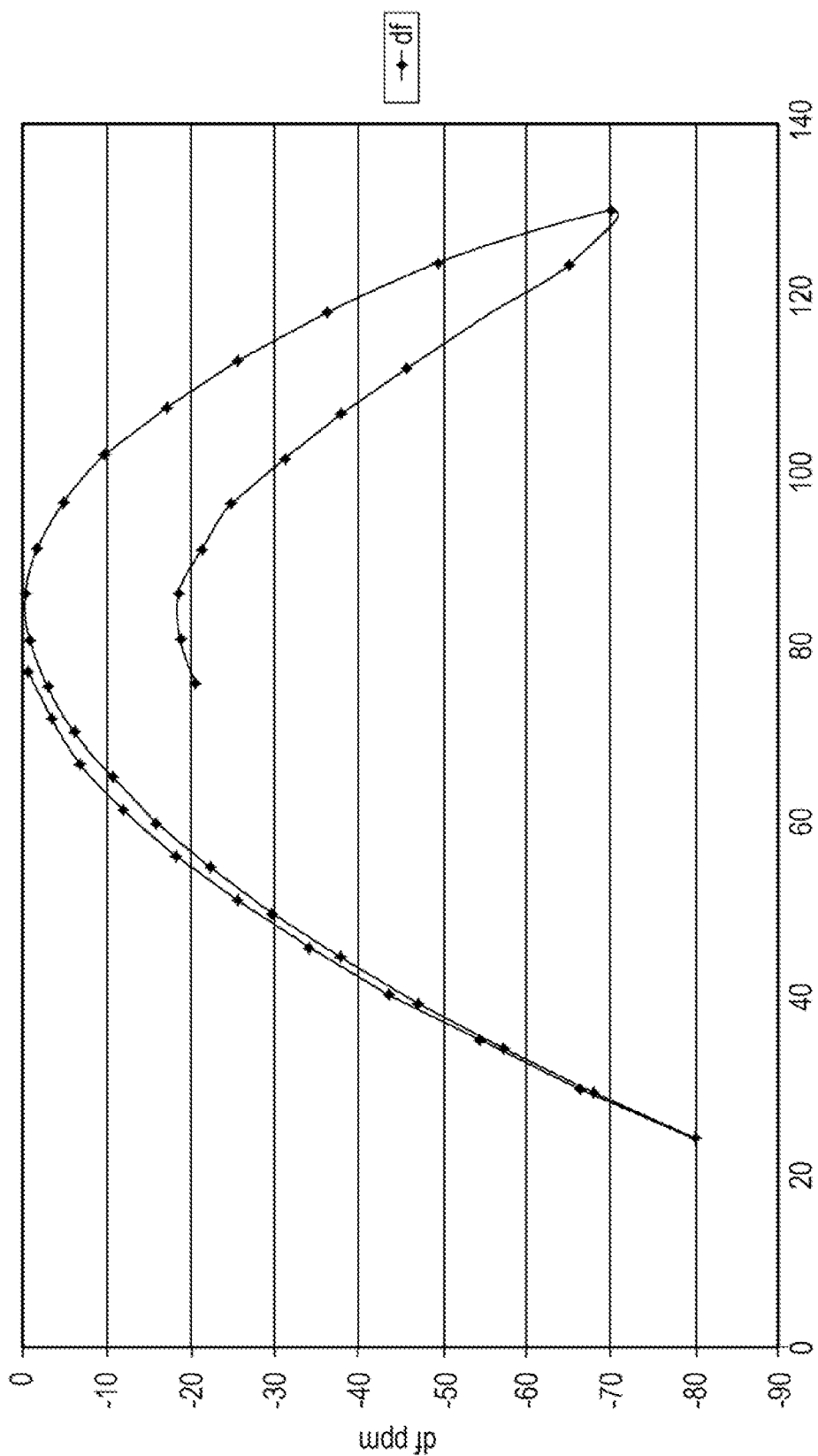
FIG. 2A is a graph illustrating changes of the center frequency of a conventional acoustic resonator structure as a function of temperature.
Figure 2B:
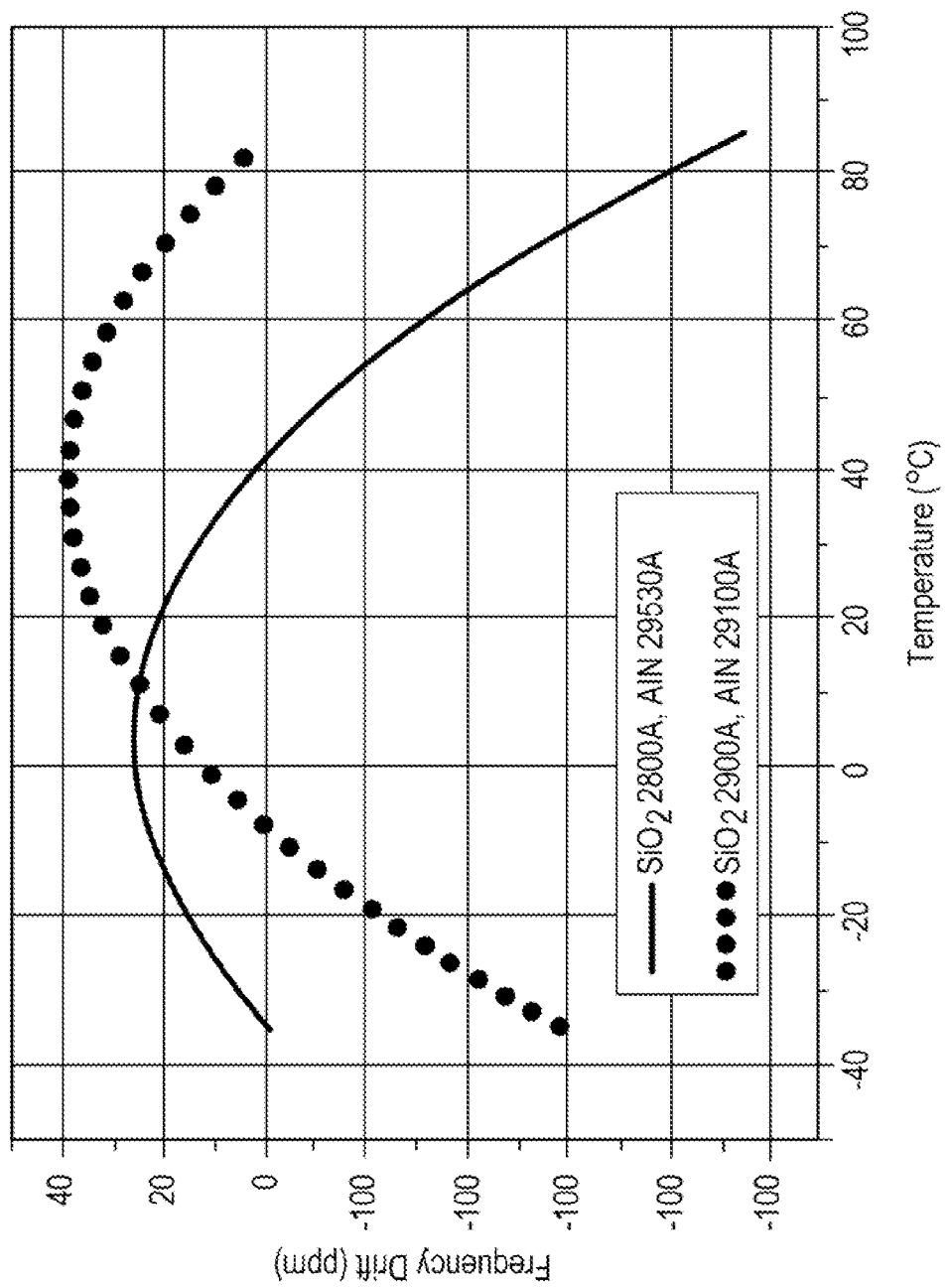
FIG. 2B is a graph illustrating turn over temperature (TOT) curves for two acoustic resonators.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. In addition, unless expressly so defined herein, terms are not to be interpreted in an overly idealized fashion. For example, the terms "isolation" or "separation" are not to be interpreted to require a complete lack of interaction between the described features.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present teachings relate generally to bulk acoustic wave (BAW) resonator structures. These resonator structures can include various types of acoustic resonators, such as, for example, FBARs, ZDRs, double bulk acoustic resonators (DBARs), and coupled resonator filters (CRFs). In certain embodiments, the BAW resonator structures can be used to provide electrical filters (e.g., ladder filters). In addition, in certain embodiments one or more acoustic resonators can be coupled to a circuit in an "FMOS" configuration, for example as described in commonly owned U.S. patent applications: Ser. No. 12/891,039, entitled. "Packaged Device with Acoustic Resonator and Electronic Circuitry and Method of Making the Same" filed on Sep. 27, 2010, to Ruby, et al.; Ser. No. 13/162,883 entitled "Capacitance Detector for Accelerometer and Gyroscope and Accelerometer and Gyroscope with Capacitance Detector" filed on Jun. 17, 2011, to Ruby, et al.; and Ser. No. 13/216,633 entitled "Acoustic Resonator Formed on a Pillar" filed on Aug. 24, 2011, to Ruby, et al. The foregoing patent applications are hereby incorporated by reference as if set forth herein.

Aspects of the present teachings are relevant to components of BAW resonator devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,711,684 to Ruby et al.; U.S. Pat. Nos. 7,791, 434 and 8,188,810, to Fazzio, et al.; U.S. Pat. No. 7,280,007 to Fentz et al.; U.S. Pat. No. 8,248,185 to Choy, et al.; U.S. Pat. No. 7,345,410 to Grannen, et al.; U.S. Pat. No. 6,828, 713 to Bradley, et al.; U.S. Patent Application Publication 20120326807 to Choy, et al.; U.S. Patent Application Publication 20100327994 to Choy, et al.; U.S. Patent Application Publications 20110180391 and 20120177816 to Larson et al.; U.S. Patent Application Pub. No. 20070205850 to Jamneala et al.; U.S. patent application Ser. No. 11/161,564 entitled: "Method of Fabrication, Rare-Earth Element Doped Piezoelectric Material with Various Amounts of Dopants and a Selected C-Axis Orientation," filed Jan. 22, 2014 to John L. Larson III; U.S. patent application Ser. No. 13/662,460 entitled "Bulk Acoustic Wave Resonator having, Piezoelectric Layer with Multiple Dopants," filed on Oct. 27, 2012 to Choy, et al.; U.S. patent application Ser. No. 13/906,873 entitled. "Bulk Acoustic Wave Resonator having Piezoelectric Layer with Varying Amounts of Dopants" to John Choy, et al. and filed on May 31, 2013; U.S. patent application Ser. No. 14/190,361, entitled "Bulk. Acoustic Wave Resonators Having Doped Piezoelectric Material and Frame Elements" to C. Feng, et al., and filed on Feb. 26, 2014; and U.S. patent application Ser. No. 14/191,771, entitled "Bulk Acoustic Wave Resonators having Doped Piezoelectric Layer" to C. Feng, et al., and filed on Feb. 27, 2014. The entire disclosure of each of the patents, published patent applications and patent application listed above are hereby specifically incorporated by reference herein. It is emphasized that the components, materials and methods of fabrication described in these patents and patent applications are representative and other methods of fabrication and materials within the purview of one of ordinary skill in the art are also contemplated. The described embodiments relate generally methods and apparatuses for fabricating to bulk acoustic wave (BAW) resonators.

Certain embodiments described below relate to a BAW resonator. The BAW resonator comprises an integrated heater and heat sensor for maintaining a substantially constant temperature of the BAW resonator. The BAW resonator comprises a substrate comprising a cavity having a plurality of sides. A first electrode is disposed over the cavity, and extends over at least one but not all of the sides of the cavity. A piezoelectric layer is disposed over at least a portion of the first electrode, and extends over at least one of the plurality of sides having the first electrode extending thereover. A second electrode is disposed over the piezoelectric layer. A contacting overlap of the first electrode, the piezoelectric layer and the second electrode disposed over the cavity forms an active area of the acoustic resonator. A heating coil is disposed over a first side of the piezoelectric layer and substantially around a perimeter adjacent to the active area of the BAW resonator. The heating coil comprises a resistor configured to receive a heater current. The BAW resonator also comprises a heat sensor disposed over a second side of the piezoelectric layer and opposing the first side, the heat sensor configured to adjust the heater current in response to a temperature of the heating coil.

Certain embodiments described below relate to a BAW resonator structure. The BAW resonator structure comprises a substrate comprising a cavity, and the cavity comprises a plurality of sides. The BAW resonator also comprises a pillar formed within the cavity, and comprises an electrical conductor disposed over an outer portion thereof. The BAW resonator structure comprises a BAW resonator supported at a central location by the pillar and suspended over the cavity. The BAW resonator comprises a first electrode disposed over the cavity; a piezoelectric layer disposed over at least a portion of the first electrode; and a second electrode disposed over the piezoelectric layer. A contacting overlap of the first electrode, the piezoelectric layer and the second electrode form an active area of the BAW resonator. The BAW resonator structure also comprises a heating coil disposed over a first side of the piezoelectric layer and substantially around a perimeter adjacent to the active area of the BAW resonator. The heating coil comprises a resistor configured to receive a heater current. The BAW resonator structure comprises a heat sensor disposed over a second side of the piezoelectric layer and opposing the first side. The heat sensor is configured to adjust the heater current in response to a temperature of the heating coil.

Figure 3A:
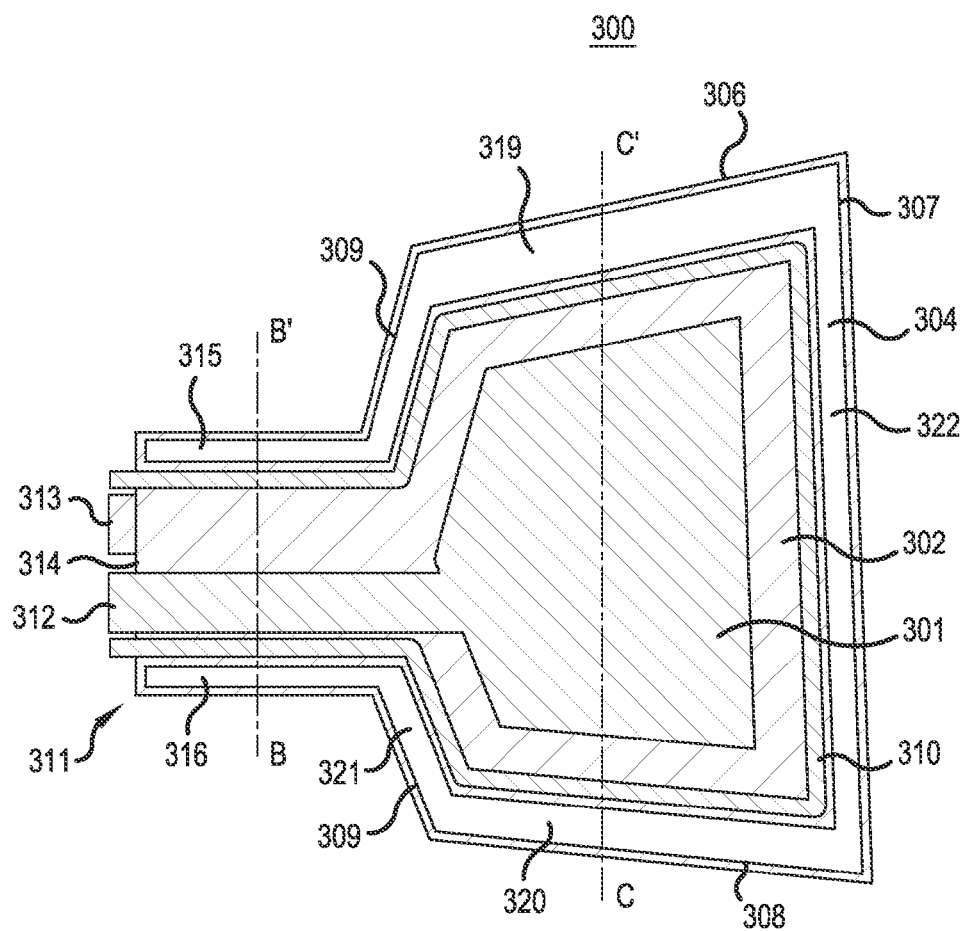
FIG. 3A is a top view of a bulk acoustic wave (BAW) resonator structure according to a representative embodiment.

FIG. 3A is top view of a BAW resonator 300 according to a representative embodiment. The BAW resonator 300 comprises a first electrode 301, a piezoelectric layer 302 and a second electrode 303 (not shown in FIG. 3A—See FIGS. 3B, 3C) stacked over one another. Notably, an optional passivation layer, which is described below, may be provided over the uppermost layers of the BAW resonator 300, and is not shown in FIG. 3A to better present the description of the arrangement of the layers of the BAW resonator 300.

The BAW resonator 300 comprises a cavity 304 formed in a substrate 305 (not visible in FIG. 3A). The cavity 304 comprises a plurality of sides 306~309, where often, but not necessarily, the number of the plurality of sides 306~309 is the same as the number of sides of the first and second electrodes 301, 303. A heating coil 310 is disposed over a first side of the piezoelectric layer and substantially around a perimeter adjacent to the active area of the BAW resonator 300. The heating coil is located at or near the perimeter adjacent to the active area of the BAW resonator 300 to ensure its electrical isolation from various electrodes and connections of the BAW resonator 300.

As described more fully below, the heating coil 310 has an electrical resistance, and based on input from a heat sensor (not shown in FIG. 3A), a heater current is provided to the heating coil to provide heat through the piezoelectric layer 302 in an effort to maintain the temperature of the acoustic stack of the BAW resonator 300, which comprises the contacting overlap of the first electrode 301, the piezoelectric layer 302 and the second electrode over the cavity 304, at a substantially constant temperature. Notably, the heat transfer through the piezoelectric layer 302, which is illustratively doped or undoped AlN, is preferred because the piezoelectric layer 302 provides a lower heat conduction than electrical conductors used in the BAW resonator 300, but provides a greater heat conduction than oxides and other dielectrics that may be found in the BAW resonator.

At a connection side 311, a first connection 312 to the first electrode 301, a second connection 313 to the second electrode 303 (not shown in FIG. 3A) and a portion of the piezoelectric layer 302 are provided. Notably, the cavity 304 extends beneath the connection side 311 to extend the distance between the BAW resonator 300 and the substrate 305. As such, in accordance with a representative embodiment, through the connection side 311, the BAW resonator 300, and especially the acoustic stack of the BAW resonator 300 is suspended in a cantilevered fashion over the cavity 304, only being connected to the substrate 305 at one side of the cavity 304. To this end, a first space 315 and a second space 316 are provided between the layers of the BAW resonator 300 and the substrate 305 at the connection side 311; a third space 319 and a fourth space 320 are provided on opposing sides of the layers of the BAW resonator 300; and a fifth space 321 and a sixth space 322 are provided on opposing sides of the layers of the BAW resonator 300, so that the BAW resonator 300 does not contact the substrate 305 at any other location than one location on the connection side 311. Illustrative the first through sixth spaces 315, 316, 319, 320, 321 and 322 have a width in the range of approximately 2 µm to approximately 30 µm.

As will be appreciated by one of ordinary skill in the art, the substrate 305 can act as a significant heat sink or heat source to the BAW resonator 300. While certain improvements can be realized by selecting a material for the substrate 305 that has a comparatively reduced coefficient of thermal conductivity compared to common materials (e.g., silicon) used for the substrate 305, the magnitude of the contact area between the BAW resonator 300 and the substrate 305 can result in significant heat transfer to/from the BAW resonator 300. As such, by providing contact between the BAW resonator 300 and the substrate 305 at only one side, the connection side 311, significant reductions in the physical contact of the BAW resonator 300 with the substrate 305 are realized. Beneficially, heat loss or gain from the substrate 305 is significantly reduced by the structure of the representative embodiments described, in connection with FIG. 3A. Furthermore, as alluded to above, and as described more fully below, the temperature of the BAW resonator 300 can be maintained at a substantially constant temperature across the acoustic stack by heat provided by the heating coil 310 through the piezoelectric layer 302, and based on feedback from the heat sensor (not shown in FIG. 3A).

In addition, the length and width of the first and second connections 312, 313 are selected to provide a comparatively large thermal resistance at the connection side 311, thereby further improving the thermal isolation of the BAW resonator 300 from the substrate 305. To this end, the first and second connections 312, 313 are comparatively long having a length between their respective first and second electrodes 301, 303 and the substrate 305 at their respective points of contact therewith of approximately 20 µm to approximately 100 µm. Moreover, the first and second connections 312, 313 are comparatively narrow and thin having a width of approximately 5 µm to approximately 25 µm and a thickness that is approximately the same thickness as the first and second electrodes 301, 303, which varies according to the frequency of operation of the BAW resonator 300. Accordingly, even at the only point of contact with the substrate 305, the thermal resistance is increased by the structure of the representative embodiments, and thermal loss/gain by BAW resonator 300 to/from the substrate 305 is comparatively reduced.

Furthermore, and although not shown in the FIGs., BAW resonator 300 may be covered by a microcap structure bonded to substrate 305, with the volume between the microcap and the BAW resonator 300 maintained at a comparatively low pressure to further reduce heat conduction. The microcap structure can be formed of etched silicon or another material and enables hermetic sealing of the BAW resonator 300. Additional details of methods, materials and assembly of a microcap structure to a base substrate may be found, for example in one or more of commonly owned U.S. Pat. Nos. 6,228,675; 6,265,246; 6,129,511; 6,787,897; 6,919,222; 6,979,597; and 7,161,283, the disclosures of which are hereby incorporated by reference as if set forth herein. The microcap structure is optional and can be omitted.

Figure 3B:
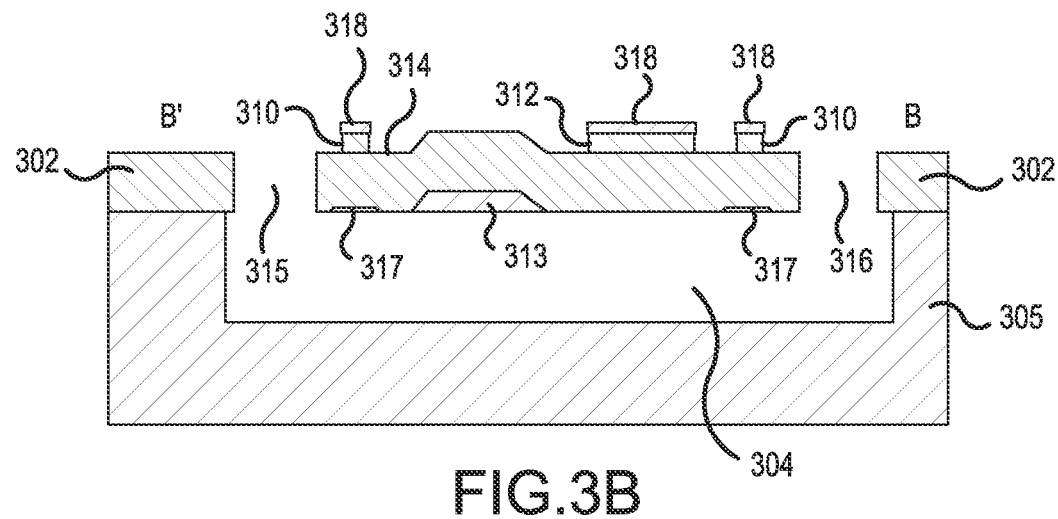
FIG. 3B is a cross-sectional view of the BAW resonator of FIG. 3A taken along line B-B'.

FIG. 3B is a cross-sectional view of BAW resonator 300 taken along line B-B'. As can be appreciated, this sectional view of BAW resonator 300 is along the connection side 311, with first space 315 and second space 316 between the first connection 312, the second connection 313 and the portion 311 of the piezoelectric layer 302. As such, and as depicted in FIG. 3B, the first connection 312 is disposed over the portion 314 of the piezoelectric layer 302 that extends onto the substrate 305. The second connection 313 is disposed beneath the portion 314, and also extends onto the substrate 305. Beneficially, the first connection 312, the portion 311 and the second connection 313 provide the structural support of the BAW resonator 300 that is suspended over the cavity 304, thereby reducing the physical contact of the BAW resonator 300 with the substrate 305.

Heating coil 310 is also disposed over the portion 311 of the piezoelectric layer 302. Directly opposing the heating coil 310 on the opposite side of the portion 314, heat sensor 317 is provided. Like heating coil 310, heat sensor 317 is disposed around the perimeter adjacent to the active area the BAW resonator 300. It is noted that a single heating coil 310 is depicted in FIG. 3B. This is merely illustrative, and it is noted that more than one heating coil (not shown) may be disposed over the piezoelectric layer 302, with the heating coils being disposed parallel to one another and substantially around a perimeter adjacent to the active area of the BAW resonator 300.

As described more fully below, the heat sensor 317 may be part of a feedback circuit (not shown) that adjusts application of heater current ($I_H$) in response to the sensed temperature of the BAW resonator 300 through the heat sensor 317. Notably, the temperature feedback circuit may be as described in U.S. patent application Ser. No. 13/361,724, a parent application of the present application.

An optional passivation layer 318 is provided over the first electrode 301 and the heating coil 310. The passivation layer 318 can be formed of various types of materials, including aluminum nitride, silicon carbide, BSG, $SiO_2$, SiN, polysilicon, and the like. The thickness of the passivation layer 318 should generally be sufficient to insulate the layers of BAW resonator 300 from the environment, including protection from moisture, corrosives, contaminants, and debris.

Figure 3C:
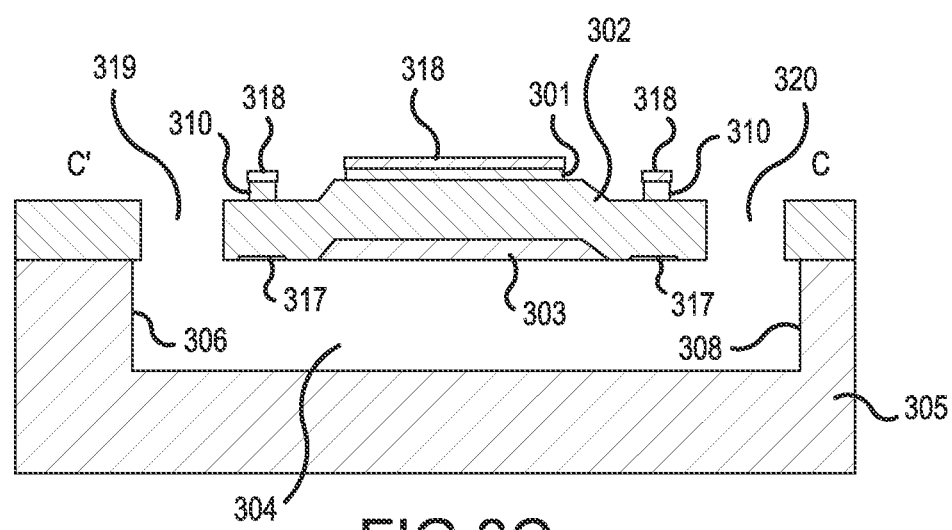
FIG. 3C is a cross-sectional view of the BAW resonator of FIG. 3A taken along line C-C'.

FIG. 3C is a cross-sectional view of BAW resonator 300 taken along line C-C'. As can be appreciated, this sectional view of BAW resonator 300 depicts the active area of the BAW resonator; namely the contacting overlap of the first electrode 301, the piezoelectric layer 302 and the second electrode 303 over the cavity 304. Notably, because of third space 319 and fourth space 320 (and other spaces) between the substrate 305 and the layers of the BAW resonator 300, the BAW resonator 300 is suspended over the cavity 304 and does not make contact with sides 306, 308 of the cavity 304, and thus does not make contact with the substrate 305 on these sides of the cavity. Of course, as noted above, the BAW resonator 300 also does not make contact with sides 307 or 309 of the cavity 304 and thus does not make contact with the substrate 305 on these sides of the cavity either. Rather, as noted above, the BAW resonator 300 only contacts the substrate 305 through first connection 312, second connection 313 and portion 314 of the piezoelectric layer 302 at the connection side 311. As such, and as depicted in FIG. 3B, the first connection 312 is disposed over the portion 314 of the piezoelectric layer 302 that extends onto the substrate 305. The second connection 313 is disposed beneath the portion 314, and also extends onto the substrate 305. Beneficially, the first connection 312, the portion 314 and the second connection 313 provide the structural support of the BAW resonator 300 that is suspended over the cavity 304, thereby reducing the physical contact of the BAW resonator 300 with the substrate 305, and the deleterious impacts of the heat sink/source the substrate 305 can create.

In a representative embodiment, the substrate 305 comprises silicon (Si) or similar material. Alternatively, and as noted above, the substrate can comprise a material having a reduced coefficient of thermal conductivity that is lower than that of silicon, but has characteristics useful to the resulting structure comprising the BAW resonator 300 and large-scale manufacturing thereof. For example, a material such as anon-conductive oxide may be used for the substrate 305. Illustrative examples of such a non-conductive oxide include hut are not limited to silicon dioxide, which has much greater thermal resistance than pure silicon, or non-etchable boro-silica glass (NEBSG).

Generally, the cavity 304 comprises air, and is formed by a known method. The first electrode 301 and the second electrode 303 are comprised of a suitable electrically conductive material such as tungsten (W) or molybdenum (Mo).

The piezoelectric layer 302 can comprise, for example, aluminum nitride (AlN), zinc oxide (ZnO) or lead zirconium titanate (PZT). Generally, the piezoelectric layer 302 comprises a highly-textured c-axis piezoelectric material where the c-axis orientations of the crystals of the piezoelectric material are well-collimated, and as such are parallel with one another and perpendicular to the plane of the electrodes (e.g., first and second electrodes 301, 303).

Illustratively, the piezoelectric layer 302 is doped AlN, wherein a number of Al atoms within the AlN crystal lattice are replaced with a selected material, such as a rare earth element at a predetermined percentage. The selected material, which is often referred to as a "doping element," may be, for example scandium (Sc). In alternative configurations, a number of Al atoms within the AlN crystal lattice may be replaced with more than one type of rare earth element at predetermined percentages, respectively. Because the doping elements replace only Al atoms (e.g., of an Al target), the percentage of nitrogen atoms in the piezoelectric material remains substantially the same regardless of the amount of doping. When percentages of doping elements are discussed herein, it is in reference to the total atoms (not including nitrogen) of the AlN piezoelectric material. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

As noted above, in certain embodiments, the piezoelectric layer 302 comprises aluminum nitride (AlN) that is doped with scandium (Sc). The atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%. When percentages of doping elements in a piezoelectric layer are discussed herein, it is in reference to the total atoms of the piezoelectric layer. Notably, when the percentages of doping elements (e.g., Sc) in a doped AlN layer are discussed herein, it is in reference to the total atoms (not including nitrogen) of the AlN piezoelectric layer 103. So, for example, and as described for example in U.S. patent application Ser. No. 14/161,564, if the Al in the piezoelectric layer of a representative embodiment has an atomic percentage of approximately 95.0%, and the Se has an atomic percentage of approximately 5.0%, then the atomic consistency of the piezoelectric layer 104 may then be represented as $Al_{0.95}Sc_{0.05}N$.

Many of the details of the materials contemplated for use as the substrate 305, first electrode 301, piezoelectric layer 302 and second electrode 303, thicknesses of these materials, and details of the methods of manufacture of the BAW resonator 300 are known and are tailored to a particular application. Many of these details are described, for example, in one or more of the patents, patent application publications and patent applications incorporated by reference above. Often, these details are not repeated in order to avoid obscuring the description of the present teachings.

The heating coil 310 may be formed by a conductive trace on an upper surface of the piezoelectric layer 302, having an electrical resistance that generates heat upon application of a heater current, discussed below, Illustratively, the heating coil 310 may be formed of one or more of a number of electrically conductive material such as tungsten, molybdenum and/or ruthenium, for example.

Illustratively, heating coil 310 has a width of approximately 1.5 µm and a thickness of approximately 500 Å to approximately 600 Å, and the sheet resistance ρ of the conductive material may be about 5-10 Ω/square. The circumference of the heating coil 310 dictates its total resistance, of course, but by way of example, the heating coil 310 provides a resistance of about 2500Ω to about 3400Ω This provides a thermal output of about 2 mW to about 4 mW when 3.3V is applied. To put reasonable bounds on the design of the heating coil 310, the applied voltages from battery sources range from about 1V to about 9V. One goal is to get the maximum temperature for an applied amount of heat, and to minimize the power needed to supply heat. To that end, in a representative embodiment, heating coil 310 provided substantially around the perimeter adjacent to the active area of BAW resonator 300 has a comparatively large electrical resistance relative to its connection at connection side 311. Beneficially, this helps to ensure that most of the heat is dissipated at the perimeter adjacent to the active area of the BAW resonator 300 and not along the routing path through connection side 311.

Like heating coil 310, heat sensor 317 may be formed by a conductive trace. The heat sensor 317 is provided on a lower surface of the piezoelectric layer 302, opposing the heating coil 310. Like heating coil 310, heat sensor 317 is disposed substantially around the perimeter adjacent to the active area of BAW resonator 300. As such, heat sensor 317 generally measures a higher temperature than the average temperature of the active region of the BAW resonator 300 because it is closer to the heating coil 310. To compensate for this, in a representative embodiment, the part of the heat sensor 317 that is in the connection side 311 samples a part of the ambient to provide a temperature closer to the actual temperature of the active FBAR.

The heat sensor 317 may be formed of one or more of a number of electrically conductive materials such as tungsten, molybdenum and/or ruthenium, for example. Generally, the material selected for the heat sensor has a comparatively high coefficient of resistivity. The heat sensor 317 is also disposed substantially around the perimeter adjacent to the active area of the BAW resonator 300.

As noted above, the heat sensor 317 is connected to a feedback circuit (not shown), which may be a Wheatstone bridge. The feedback circuit includes large value resistors. The large value resistors may have resistances of about 100Ω, for example. The feedback circuit further includes a reference resistor and heat sensor resistor. The reference resistor, which may be located off-chip (e.g., on an BAW resonator wafer), may have a resistance of about 1.5Ω, for example. The heat sensor resistor is typically a variable resistor, since its value varies in response to the heat generated by the heating coil 310. For example, the heat sensor resistor may vary in resistance from approximately 1Ω to approximately 2Ω (the value of the reference resistor). However, the heat sensor resistor can also have a resistance of approximately 100Ω to 3000Ω depending on the requirements of the circuit design.

A transimpedance amplifier (TIA) is included in the feedback circuit and receive voltages from the node between the lame value resistor and the reference resistor and from the large value resistor and the heat sensor resistor, and determines the difference between the receive voltages. The TIA converts the voltage difference into a bias current $I_{bias}$ that is applied to the heater current $I_H$ in order to adjust the heat provided by the heating coil 310. For example, when the resistance of the heat sensor resistor is less than the resistance of the reference resistor, indicating a lower than desired temperature, the TIA detects a voltage difference across the Wheatstone bridge, and applies a positive bias current $I_{bias}$ to increase the magnitude of the heater current $I_H$, thus increasing the amount of heat energy (generated by the heating coil 310. Likewise, when the resistance of the heat sensor resistor is greater than the reference resistor, indicating a higher than desired temperature, the TIA detects a negative voltage difference across the Wheatstone bridge, and applies a negative bias current $I_{bias}$ to reduce the magnitude of the heater current $I_H$, thus decreasing the amount of heat energy generated by the heating coil. When the resistances of the heat sensor resistor 730 and the reference resistor are equal, the TIA detects no voltage difference and thus applies no bias current $I_{bias}$. In this manner, the temperature of the BAW resonator 300 is kept substantially constant. The target temperature would be to operate at the TOT as the change in frequency for a change in temperature is minimum at TOT. In addition, the TOT of the BAW resonator 300 would be selected to be slightly higher than the highest ambient temperature expected. The actual accuracy in setting the temperature depends on the accuracy of the feedback circuitry and manufacturing tolerances of the reference resistor and can be as small as 0.1° C.

Figure 4A:
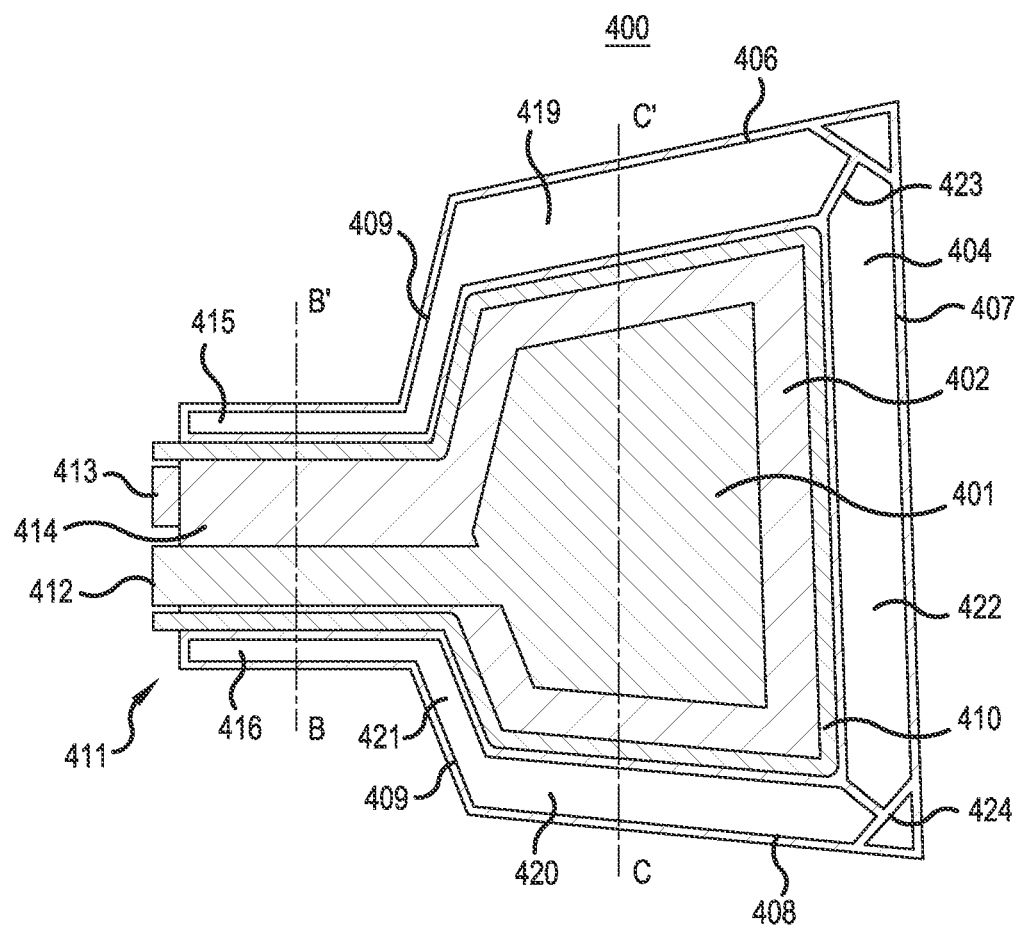
FIG. 4A is a top view of a bulk acoustic wave (BAW) resonator according to a representative embodiment.

FIG. 4A is a top view of a bulk acoustic wave (BAW) resonator 400 according to a representative embodiment. Many aspects of the BAW resonator 400 are common to those of BAW resonator 300 and are not necessarily repeated presently.

The BAW resonator 400 comprises a first electrode 401, a piezoelectric layer 402 and a second electrode 403 (not shown in FIG. 4A—See FIGS. 4B, 4C) stacked over one another. Notably, an optional passivation layer, which is described below, may be provided over the uppermost layers of the BAW resonator 400, and is not shown in FIG. 3A to better present the description of the arrangement of the layers of the BAW resonator 400.

The BAW resonator 400 comprises a cavity 404 formed in a substrate 405 (not visible in FIG. 4A). The cavity 404 comprises a plurality of sides 406~409, where often, but not necessarily, the number of the plurality of sides 406~409 is the same as the number of sides of the first and second electrodes 401, 403. A heating coil 410 is disposed over a first side of the piezoelectric layer and substantially around a perimeter adjacent to the active area of the BAW resonator 400. As described ignore fully below, the heating coil 410 has an electrical resistance, and based on input from a heat sensor (not shown in FIG. 4A), a heater current is provided to the heating coil and through the piezoelectric layer 402 in an effort to maintain the temperature of the acoustic stack of the BAW resonator 400, which comprises the contacting overlap of the first electrode 401, the piezoelectric layer 402 and the second electrode 403 over the cavity 404, at a substantially constant temperature.

At a connection side 411, a first connection 412 to the first electrode 401, a second connection 413 to the second electrode 403 (not shown in FIG. 4A) and a portion of the piezoelectric layer 402 are provided, Notably, the cavity 404 extends beneath the connection side 411 to extend the distance between the BAW resonator 400 and the substrate 405. The first connection 412, the second connection 413 and the portion 414 extend over side 409 and onto the substrate 405 (not shown in FIG. 4A). As such, in accordance with a representative embodiment, through the connection side 411, the BAW resonator 400, and especially the active area of the BAW resonator is suspended in a cantilevered fashion over the cavity 404, only being connected to the substrate 405 at one side of the cavity. To this end, a first space 415 and a second space 416 are provided between the layers of the BAW/resonator 400 and the substrate 405 at the connection side 411; a third space 419 and a fourth space 420 are provided on opposing sides of the layers of the BAW resonator 400; and a fifth space 421 and a sixth space 422 are provided on opposing sides of the layers of the BAW resonator 400, so that the BAW resonator 400 does not contact the substrate 405 at any other location than one location on the connection side 411.

As will be appreciated by one of ordinary skill in the art, the substrate 405 can act as a significant heat sink or heat source to the BAW resonator 400. While certain improvements can be realized by selecting a material for the substrate 405 that has a comparatively reduced coefficient of thermal conductivity compared to common materials (e.g., silicon) used for the substrate 405, the magnitude of the contact area between the BAW resonator 400 and the substrate 405 can result significant heat transfer to/from the BAW resonator 400. As such, by providing contact between the BAW resonator 400 and the substrate 405 at only one side, the connection side 411, significant reductions in the physical contact of the BAW resonator 400 with the substrate 405 are realized. Beneficially, heat loss or gain from the substrate 405 is significantly reduced by the structure of the representative embodiments described in connection with FIG. 1A. Furthermore, as alluded to above, and as described more fully below, the temperature of the BAW resonator 400 can be maintained at a substantially constant temperature across the acoustic stack by heat provided by the heating coil 410 through the piezoelectric layer 402, and based on feedback from the heat sensor (not shown FIG. 4A).

In addition, the length and width of the first and second connections 412, 413 are selected to provide a comparatively large thermal resistance at the connection side 411, thereby further improving the thermal isolation of the BAW resonator 400 from the substrate 405. To this end, the first and second connections 412, 413 are comparatively long having a length between their respective first and second electrodes 401, 403 and the substrate 405 at their respective points of contact therewith of approximately 20 µm to approximately 100 µm. Moreover, the first and second connections 412, 413 are comparatively narrow and thin having a width of approximately 5 µm to approximately 25 µm, and a thickness that is approximately the same thickness as the first and second electrodes 401, 403, which varies according to the frequency of operation of the BAW resonator 400. Accordingly, even at the only point of contact with the substrate 405, the thermal resistance is increased by the structure of the representative embodiments, and thermal loss/gain by BAW resonator 400 to/from the substrate 405 is comparatively reduced.

Furthermore, and although not shown in the FIGs., BAW resonator 400 may be covered by a microcap structure bonded to substrate 405, with the volume between the microcap structure and the BAW resonator 400 maintained at a comparatively low pressure to further reduce heat conduction. The microcap structure can be formed of etched silicon or another material and enables hermetic sealing of the BAW resonator 400. Additional details of methods, materials and assembly of a microcap structure to a base substrate may be found, for example in one or more of commonly owned U.S. Pat. Nos. 6,228,675; 6,265,246; 6,429,511; 6,787,897; 6,919,222; 6,979,597; and 7,161,283, the disclosures of which are hereby incorporated by reference as if set forth herein. The microcap structure is optional and can be omitted.

The BAW resonator 400 also comprises a first tether 423 and a second tether 424. It is noted that while two tethers are depicted, more or fewer tethers (not shown) are contemplated. The first and second tethers 423, 424 are formed by patterning the piezoelectric layer 402 to extend between from the portion of the BAW resonator 400 suspended over the cavity 404 and sides of the cavity (in this case sides 406, 407 and 408) with connections being made along two sides in this illustrative example. First and second tethers 423, 424 provide increased structural stability for BAW resonator 400. The first and second tethers 423, 424 are configured to act essentially as "shock absorbers," limiting or damping transfer of externally applied forces, from the environment, to the BAW resonator 400. Notably, the tethers are comparatively long, comparatively narrow and comparatively thin, and thereby have a comparatively high thermal resistance. To this end, the first and second tethers 423, 424 are comparatively long, having a length between their respective connections to the piezoelectric layer 302 suspended over the cavity and the substrate 405 at their respective points of contact therewith of approximately 5 µm to approximately 30 µm. Moreover, the first and second tethers 423, 424 are comparatively narrow and thin having a width of approximately 1 µm to approximately 3 µm and a thickness of approximately 0.5 µm to approximately 3 µm. Accordingly, thermal loss/gain by BAW resonator 400 to/from the substrate 305 created by the connection of the tethers to the acoustic stack of the BAW resonator is comparatively reduced.

Figure 4B:
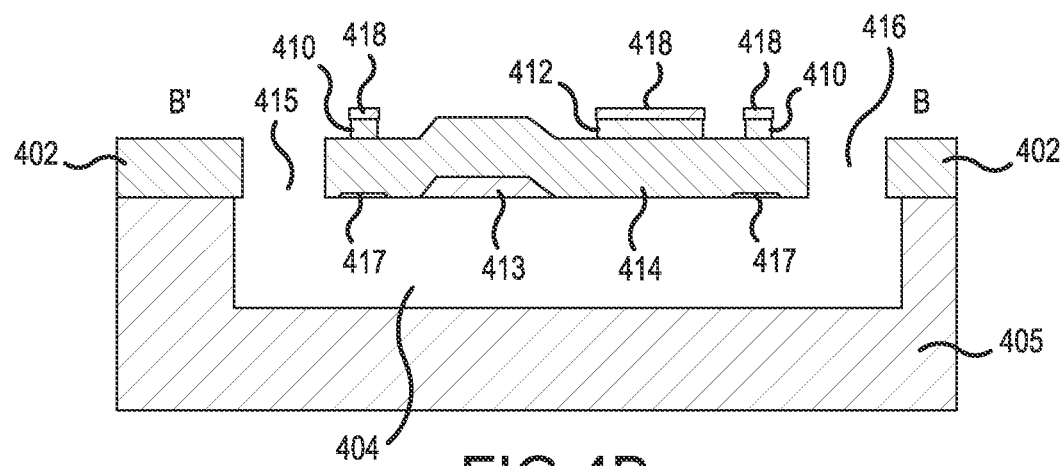
FIG. 4B is a cross-sectional view of the BAW resonator of FIG. 4A taken along line B-B'.

FIG. 4B is a cross-sectional view of BAW resonator 400 taken along line B-B'. As can be appreciated, this sectional view of BAW resonator 400 is along the connection side 411, with first space 415 and second space 416 between the first connection 412, the second connection 413 and the portion 414 of the piezoelectric layer 402. As such, and as depicted in FIG. 3B, the first connection 412 is disposed over the portion 414 of the piezoelectric layer 402 that extends onto the substrate 405. The second connection 413 is disposed beneath the portion 414, and also extends onto the substrate 405. Beneficially, the first connection 412, the portion 414 and the second connection 413 provide the structural support of the BAW resonator 400 that is suspended over the cavity 404, thereby reducing the physical contact of the BAW resonator 400 with the substrate 405.

Heating coil 410 is also disposed over the portion 414 of the piezoelectric layer 402. Directly opposing the heating coil 410 on the opposite side of the portion 414, heat sensor 417 is provided. Like heating coil 410, heat sensor 417 is disposed around the perimeter adjacent to the active area of the BAW resonator 400. As described more fully below, the heat sensor 417 may be part of a feedback circuit (not shown) that adjusts application of heater current ($I_H$) in response to the sensed temperature of the BAW resonator 400 through the heat sensor 417. Notably, the temperature feedback circuit may be as described in U.S. patent application Ser. No. 13/361,724, a parent application of the present application.

An optional passivation layer 418 is provided over the first electrode 401 and the heating coil 410, The passivation layer 418 can be formed of various types of materials, including aluminum nitride, silicon carbide, BSG, $SiO_2$, SiN, polysilicon, and the like. The thickness of the passivation layer 418 should generally be sufficient to insulate the layers of BAW resonator 400 from the environment, including protection from moisture, corrosives, contaminants, and debris.

Figure 4C:
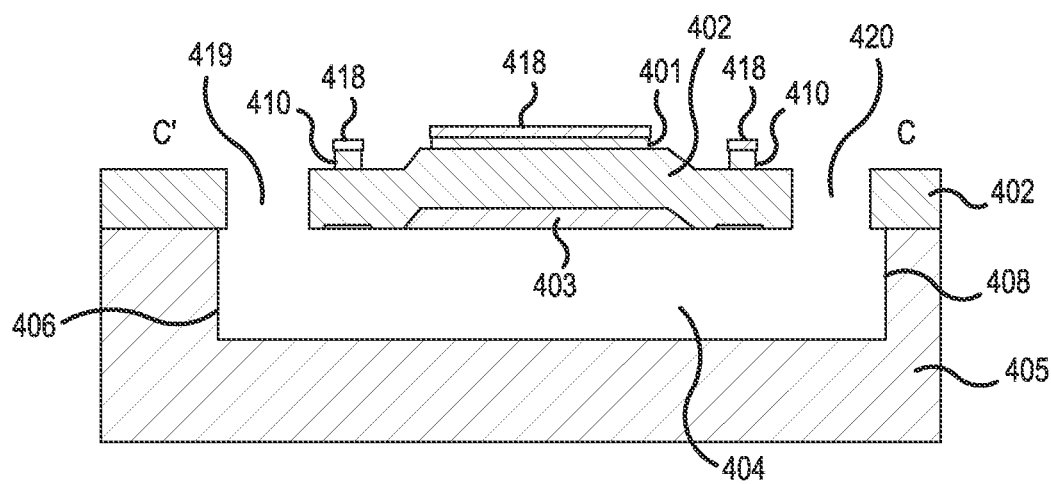
FIG. 4C is a cross-sectional view of the BAW resonator of FIG. 4A taken along line C-C'.

FIG. 4C is a cross-sectional view of BAW resonator 400 taken along line C-C'. As can be appreciated, this sectional view of BAW resonator 400 depicts the active area of the BAW resonator; namely the contacting overlap of the first electrode 401, the piezoelectric layer 402 and the second electrode over the cavity 404. Notably, because of third space 419 and fourth space 420 (and other spaces) between the substrate 405 and the layers of the BAW resonator 400, the BAW resonator 400 is suspended over the cavity 404 and does not make contact with sides 406, 408 of the cavity 404, and thus does not make contact with the substrate 405 on these sides of the cavity. Of course, as noted above, the BAW resonator 400 also does not make contact with sides 407 or 409 of the cavity 404, and thus does not make contact with the substrate 405 on these sides of the cavity either.

Rather, as noted above, the BAW resonator 100 only contacts the substrate 105 through first connection 412, second connection 413 and portion 414 of the piezoelectric layer 402 at the connection side 411. As such, and as depicted in FIG. 3B, the first connection 412 is disposed over the portion 414 of the piezoelectric layer 402 that extends onto the substrate 405. The second connection 413 is disposed beneath the portion 111, and also extends onto the substrate 105. Beneficially, the first connection 412, the portion 414 and the second connection 413 provide the structural support of the BAW resonator 400 that is suspended over the cavity 404, thereby reducing the physical contact of the BAW resonator 400 with the substrate 105, and the deleterious impacts of the heat sink/source the substrate 405 can create.

Figure 5A:
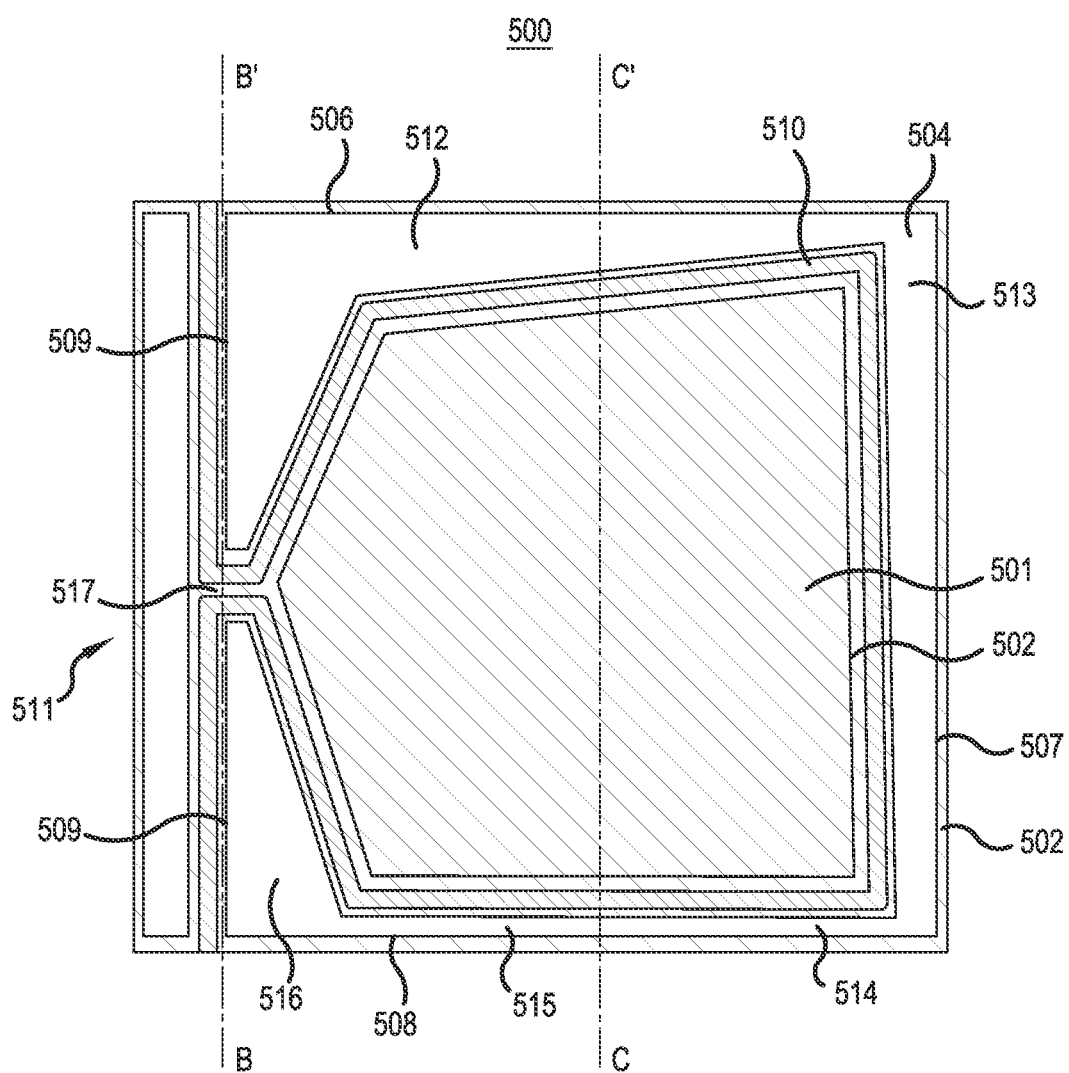
FIG. 5A is a top view of a bulk acoustic wave (BAW) resonator structure according to a representative embodiment.

FIG. 5A is top view of a BAW resonator 500 according to a representative embodiment. The BAW resonator 500 comprises a first electrode 501, a piezoelectric layer 502 and a second electrode 503 (not shown in FIG. 5A—See FIGS. 5B, 5C) stacked over one another. Notably, an optional passivation layer, which is described below, may be provided over the uppermost layers of the BAW resonator 500, and is not shown in FIG. 5A to better present the description of the arrangement of the layers of the BAW resonator 500.

The BAW resonator 500 comprises a cavity 501 formed in a substrate 505 (not visible in FIG. 5A). The cavity 504 comprises a plurality of sides 506~509, where often, but not necessarily, the number of the plurality of sides 506~509 is the same as the number of sides of the first and second electrodes 501, 503. A heating coil 510 is disposed over a first side of the piezoelectric layer 502 and substantially around a perimeter adjacent to the active area of the BAW resonator 500. As described more fully below, the heating coil 510 has an electrical resistance, and based on input from a heat sensor (not shown in FIG. 3A), a heater current is provided to the heating coil and through the piezoelectric layer 502, as described above, in an effort to maintain the temperature of the active area of the BAW resonator 500, which comprises the contacting overlap of the first electrode 501, the piezoelectric layer 502 and the second electrode over the cavity 504, at a substantially constant temperature.

Figure 5B:
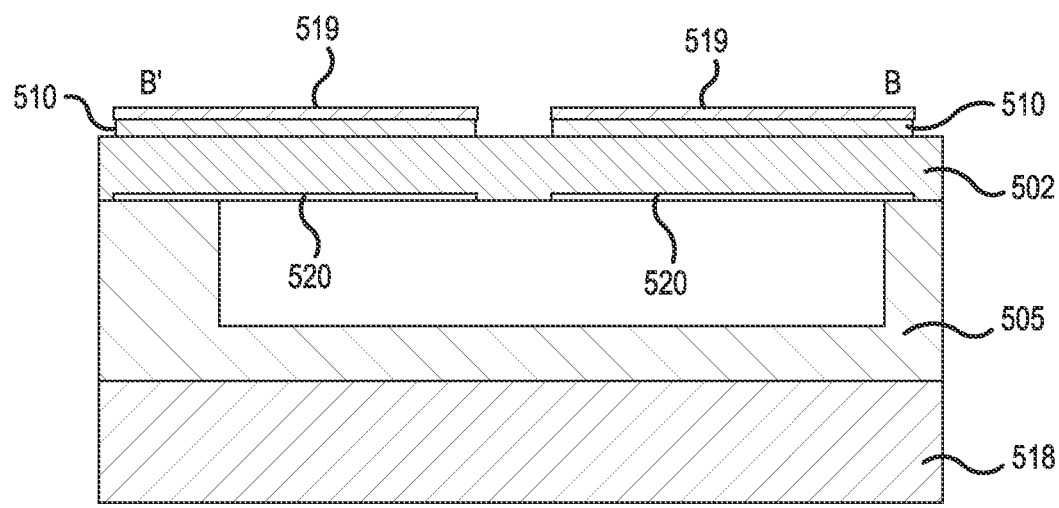
FIG. 5B is a cross-sectional view of the BAW resonator of FIG. 5A taken along line B-B'.

At a connection side 511, the heating coil 510 and a heat sensor 520 (not shown in FIG. 5A) are disposed on opposing sides of portion 517 of the piezoelectric layer 502 that extends to the substrate 505. As depicted in FIG. 5B, heating coil 510 is disposed over the piezoelectric layer 502 (and thus portion 517), whereas heat sensor 520 is disposed under the piezoelectric layer 50 (and thus portion 517). The heating coil 510 and the heat sensor 520 (again, not shown in FIG. 5A) are routed to a feedback circuit (not shown), such as described above. Like the representative embodiments described above, the cavity 504 extends beneath the connection side 511 to extend the distance between the BAW resonator 500 and the substrate 505. Moreover, the acoustic stack of the BAW resonator 500 is suspended over the cavity 504 by a pillar 521 (not shown in FIG. 5A) at a central point of the BAW resonator 500, As such, in accordance with a representative embodiment, through the connection side 511 and the pillar 521, the BAW resonator 500, and especially the acoustic stack of the BAW resonator 500 is suspended over the cavity 504, only being connected to the substrate 518 at the pillar 521 and one side 509 of the cavity 504. To this end, a first space 516 is provided between the layers of the BAW resonator 500 and the substrate 505 at the connection side 511; a second space 512 and a third space 515 are provided on opposing sides of the layers of the BAW resonator 500; and a fourth space 513 is provided at an opposing side of first space 516 on opposing sides of the layers of the BAW resonator 500, so that the BAW resonator 500 does not contact the substrate 505 at any other location than one location on the connection side 511, and only through the connection of the heating coil 510 and the heat sensor 520, Notably, the first through fourth spaces 516, 512, 515 and 513 have widths in the range of approximately 2 μm to approximately 30 μm. As such, by providing contact between the BAW resonator 500 and the substrate 505 at only one side, the connection side 511, significant reductions in the physical contact of the BAW resonator 500 with the substrate 505 are realized. Beneficially, heat loss or gain from the substrate 505 is significantly reduced by the structure of the representative embodiments described in connection with FIG. 5A. Notably, the spaces have widths in the range of approximately 2 μm to approximately 30 μm.

In addition, the length and width of the heating coil 510 and the heat sensor 520 (not shown in FIG. 5A) are selected to provide a comparatively large thermal resistance at the connection side 511, thereby further improving the thermal isolation of the BAW resonator 500 from the substrate 305. To this end, heating coil 510 and the heat sensor 520 (not shown in FIG. 5A) are comparatively long having a length between the piezoelectric layer 502 that is suspended over the cavity 504 the substrate 505 at their respective points of contact therewith of approximately 50 μm to approximately 200 μm. Moreover, the heating coil 510 and heat sensor 520 are comparatively narrow and thin having a width of approximately 1 μm to approximately 5 μm and a thickness of approximately 500 Å to approximately 2 μm. Accordingly, even at the only point of contact with the substrate 505, the thermal resistance is increased by the structure of the representative embodiments, and thermal loss/gain by BAW resonator 500 to/from the substrate 505 is comparatively reduced.

As will be appreciated by one of ordinary skill in the art, the substrate 505 can act as a significant heat sink or heat source to the BAW resonator 500, While certain improvements can be realized by selecting a material for the substrate 505 that has a comparatively reduced coefficient of thermal conductivity compared to common materials (e.g., silicon) used for the substrate 505, the extent of physical contact between the BAW resonator 500 and the substrate 505 can result in significant heat transfer to/from the BAW resonator 500, In one aspect, the thermal connection between the substrate 505 and the BAW resonator 500 is minimized by the limited connection at connection side 511. As described below, pillar 521 (again, not shown in FIG. 5A) provides improved structural support to the acoustic stack of the BAW resonator 500 while providing a comparatively significantly reduction in thermal conduction between the acoustic stack of the BAW resonator 500 and the substrate 505.

FIG. 5B is a cross-sectional view of BAW resonator 500 taken along line 13-13'. As can be appreciated, this sectional view of BAW resonator 500 is along the connection side 511. Heating coil 510 is disposed over the portion 517 of the piezoelectric layer 502. Directly opposing the heating coil 510 on the opposite side of the portion 517, heat sensor 520 is provided. Like heating coil 510, heat sensor 520 is disposed around the perimeter adjacent to the active area of the BAW resonator 500. As described above, the heat sensor 520 may be part of a feedback circuit (not shown) that adjusts application of heater current ($I_H$) in response to the sensed temperature of the BAW resonator 500 through the heat sensor 520. Notably, the temperature feedback circuit may be as described in U.S. patent application Ser. No. 13/361,724, a parent application of the present application.

An optional passivation layer 519 is provided over the heating coil 510. The passivation layer 519 can be formed of various types of materials including aluminum nitride, silicon carbide, BSG, SiO$_2$, polysilicon, and the like. The thickness of the passivation layer 519 should generally be sufficient to insulate the layers of BAW resonator 500 from the environment, including protection from moisture, corrosives, contaminants, and debris.

Figure 5C:
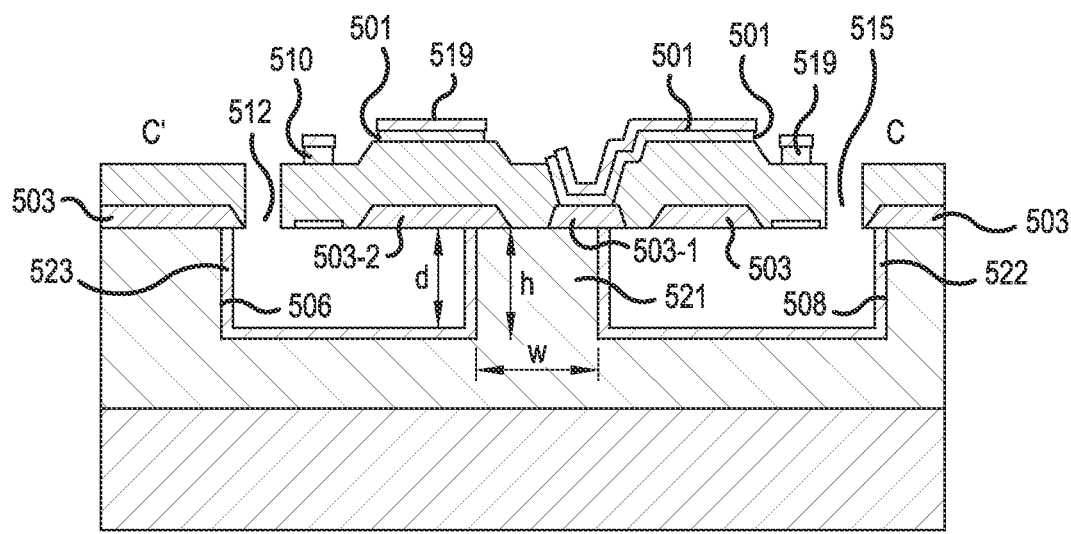
FIG. 5C is a cross-sectional view of the BAW resonator of FIG. 5A taken along line C-C'.

FIG. 5C is a cross-sectional view of the BAW resonator 500 taken along line C-C'. The BAW resonator 500 is disposed over pillar 521 at a central location relative of the BAW resonator 500.

A first electrical conductor 522 is provided along side 508 of the cavity 504, across a bottom surface of the cavity 504, and up an outer portion of the pillar 521. The first electrical conductor 522 is in electrical contact with a first part 503-1 of the second electrode 503 that in turn is in contact with the first electrode 501 as depicted in FIG. 5C. Signals to/from the first electrode 501 are made through the first electrical conductor 522. A second electrical conductor 523 is provided along side 506 of the cavity 504, across a bottom surface of the cavity 504, and up an outer portion of the pillar 521. The first electrical conductor 522 is in electrical contact with a second part 503-2 of the second electrode 503, Notably, the first part 503-1 and the second part 503-2 are electrically isolated from one another so that first electrical conductor 522 forms a first conductive path connected to BAW resonator 500, and second electrical conductor 523 forms a second conductive path connected to BAW resonator 500. One of the first and second electrical conductors 522 and 523 is a positive RF (or "hot") connection, and the other one of the first and second electrical conductors 522 and 523 is a negative RF (or "ground") connection.

Pillar 521 is illustratively silicon and typically forms part of an etched silicon wafer, as illustrated for example in FIG. 5C. Alternatively, the substrate 505 and the pillar 521 can be made of a material having lower thermal conductivity than silicon, such as a non-conductive oxide. Illustrative examples of such a non-conductive oxide include but are not limited to silicon dioxide, which has much greater thermal resistance than pure silicon, or non-etchable boro-silica glass (NEBSG). Other materials within the purview of one of ordinary skill in the art having the benefit of the present disclosure are also contemplated for use as the materials of the pillar 521. In some embodiments, pillar 521 can be replaced with a pillar formed of a material having lower thermal conductivity than silicon, such as a non-conductive oxide. In such an embodiment, the pillar 521 would be provided in the cavity 504 after formation of thereof in the substrate 505, which would be made of a different material (e.g., silicon). This too can provide improved thermal insulation for BAW resonator 500. Again, the pillar 521 can be made of a non-conductive oxide that has a much greater thermal resistance than pure silicon, Other materials within the purview of one of ordinary skill in the art having the benefit of the present disclosure are also contemplated for use as the materials of the pillar 521.

Another useful aspect of the structure depicted in FIG. 5C is the separation of the layers of the acoustic stack of BAW resonator 500 from the substrate 505 by the pillar 521 and the cavity 504, and the comparatively small area of contact between the pillar 521 and the layers of the acoustic stack of the BAW resonator 500. Notably, the greater the separation distance provided between the BAW resonator 500 and the substrate 505, the lower the transmission of heat therebetween because of a greater thermal resistance created by the comparatively increased separation. As such, the depth "d" of the cavity 504 and the height "h" of the pillar 521 are optimized to reduce the degree of heat transfer therebetween. In accordance with a representative embodiment, the depth "d" of the cavity 504 and the height "h" of the pillar 521 are approximately 0.5 μm to approximately 4 μm. Moreover, by providing a comparatively small width "w" the contact area between the layers of the acoustic stack of the BAW resonator 500, a reduction in heat transfer is realized due to a comparatively larger thermal resistance. In accordance with a representative embodiment, the width "w" is approximately 5 μm to approximately 15 μm.

While example embodiments are disclosed herein, one of ordinary skill in the art will appreciate that many variations that are in accordance with the present teachings are possible and remain within the scope of the appended claims. The invention therefore is not to be restricted except within the scope of the appended claims.

The invention claimed is:

1. A bulk acoustic wave (BAW) resonator, comprising:
a substrate comprising a cavity having a plurality of sides;
a first electrode disposed over the cavity, the first electrode extending over at least one but not all of the sides of the cavity;
a piezoelectric layer disposed over at least a portion of the first electrode, and extending over the at least one of the plurality of sides having the first electrode extending thereover;
a second electrode disposed over the piezoelectric layer, and extending over the at least one of the plurality of sides, a contacting overlap of the first electrode, the piezoelectric layer and the second electrode forming an active area of the BAW resonator, wherein the second electrode does not overlap the first electrode over the at least one of the plurality of sides;
a heating coil disposed over a first side of the piezoelectric layer and substantially around a perimeter adjacent to the active area of the BAW resonator, the heating coil comprising a resistor configured to receive a heater current; and
a heat sensor disposed over a second side of the piezoelectric layer and opposing the first side, the heat sensor configured to adjust the heater current in response to a temperature of the heating coil.

2. The BAW resonator of claim 1, further comprising a first conductive trace configured to provide the heater current to the heating coil.

3. The BAW resonator of claim 2, wherein the first conductive trace extends over the at least one of the plurality of sides.

4. The BAW resonator of claim 3, wherein the first conductive trace for providing the heater current to the heating coil comprises a metal trace having a thickness of about 300 Å to about 10000 Å, and wherein the heating coil comprises a heater resistor having a resistance between about 100Ω and about 5000Ω.

5. The BAW resonator of claim 4, wherein the metal trace of the heating coil comprises at least one of molybdenum, tungsten and ruthenium.

6. The BAW resonator of claim 1, wherein the piezoelectric layer comprises scandium doped aluminium nitride (ScAlN).

7. The BAW resonator of claim 6, wherein an atomic percentage of scandium in the piezoelectric layer is approximately 0.5% to less than approximately 10.0%.

8. The BAW resonator of claim 6, wherein an atomic percentage of scandium in the piezoelectric layer is approximately 2.5% to less than approximately 5.0%.

9. The BAW resonator of claim 1, further comprising a second conductive trace configured to provide heat sensor current to the heat sensor, a change in the temperature of the heating coil causing a corresponding change in sensor resistance of the heat sensor.

10. The BAW resonator of claim 9, wherein the second conductive trace extends over the at least one of the plurality of sides.

11. The BAW resonator of claim 1, further comprising at least one tether connected between the piezoelectric layer and one of the sides of the cavity, the at least one tether being configured to limit transfer of externally applied forces to the BAW resonator.

12. The BAW resonator of claim 1, wherein the at least one of the plurality of sides is one side of the cavity.

13. The BAW resonator of claim 1, wherein the piezoelectric layer comprises rare-earth element doped piezoelectric material.

14. A BAW resonator structure, comprising:
a substrate comprising a cavity, the cavity comprising a plurality of sides;
a pillar formed within the cavity, the pillar comprising: a material having a coefficient of thermal conductivity that is equal to or less than a thermal conductivity of silicon (Si); and an electrical conductor disposed over an outer portion thereof;
a BAW resonator supported at a central location by the pillar and suspended over the cavity, the BAW resonator comprising: a first electrode disposed over the cavity; a piezoelectric layer disposed over at least a portion of the first electrode; and a second electrode disposed over the piezoelectric layer, a contacting overlap of the first electrode, the piezoelectric layer and the second electrode forming an active area of the BAW resonator;
a heating coil disposed over a first side of the piezoelectric layer and substantially around a perimeter adjacent to the active area of the BAW resonator, the heating coil comprising a resistor configured to receive a heater current; and
a heat sensor disposed over a second side of the piezoelectric layer and opposing the first side, the heat sensor configured to adjust the heater current in response to a temperature of the heating coil.

15. The BAW resonator structure of claim 14, wherein the piezoelectric layer comprises scandium doped aluminium nitride (ScAlN).

16. The BAW resonator structure of claim 15, wherein an atomic percentage of scandium in the piezoelectric layer is approximately 0.5% to less than approximately 10.0%.

17. The BAW resonator structure of claim 15, wherein an atomic percentage of scandium in the piezoelectric layer is approximately 2.5% to less than approximately 5.0%.

18. The BAW resonator structure of claim 14, further comprising a first conductive trace configured to provide the heater current to the heating coil.

19. The BAW resonator structure of claim 18, wherein the first conductive trace extends over only one of the plurality of sides.

20. The BAW resonator structure of claim 14, further comprising a second conductive trace configured to provide heat sensor current to the heat sensor, a change in the temperature of the heating coil causing a corresponding change in sensor resistance of the heat sensor.

21. The BAW resonator structure of claim 20, wherein the second conductive trace extends over only one of the plurality of sides.

22. The BAW resonator structure of claim 14, wherein the BAW resonator further comprises a conductive pattern provided in the cavity, the electrical conductor disposed over the outer portion of the pillar being in electrical contact with the conductive pattern.

23. The BAW resonator structure of claim 14, wherein the material comprises non-etchable borosilicate glass (NEBSG).

24. The BAW resonator structure of claim 14, wherein the substrate comprises a material having a lower coefficient of thermal conductivity than silicon (Si).

25. The BAW resonator structure of claim 14, wherein the BAW resonator has an active region that is suspended entirely over the cavity.

26. The BAW resonator structure of claim 14, wherein the piezoelectric layer comprises rare-earth element doped piezoelectric material.

* * * * *